US010966311B2

(12) United States Patent
Kim et al.

(10) Patent No.: US 10,966,311 B2
(45) Date of Patent: Mar. 30, 2021

(54) METHOD FOR CROSS-TALK REDUCTION TECHNIQUE WITH FINE PITCH VIAS

(71) Applicant: CRAY INC., Seattle, WA (US)

(72) Inventors: Hyunjun Kim, Seattle, WA (US); Andrew J. Becker, Chippewa Falls, WI (US); Paul Taylor Wildes, Chippewa Falls, WI (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/882,146

(22) Filed: May 22, 2020

(65) Prior Publication Data

US 2020/0375024 A1 Nov. 26, 2020

Related U.S. Application Data

(60) Provisional application No. 62/852,285, filed on May 23, 2019.

(51) Int. Cl.
| | |
|---|---|
| *H05K 1/02* | (2006.01) |
| *H05K 1/11* | (2006.01) |
| *H05K 3/00* | (2006.01) |
| *H05K 3/40* | (2006.01) |
| *H05K 1/18* | (2006.01) |
| *H05K 1/14* | (2006.01) |
| *H05K 3/42* | (2006.01) |

(52) U.S. Cl.
CPC .......... *H05K 1/0228* (2013.01); *H05K 1/113* (2013.01); *H05K 1/144* (2013.01); *H05K 1/181* (2013.01); *H05K 3/0047* (2013.01); *H05K 3/4007* (2013.01); *H05K 3/42* (2013.01); *H05K 2201/041* (2013.01); *H05K 2201/09636* (2013.01)

(58) Field of Classification Search
CPC ...... H05K 1/0228; H05K 1/144; H05K 1/113; H05K 1/181; H05K 3/42; H05K 3/0047; H05K 3/4007; H05K 2201/041; H05K 2201/09636
USPC ........................................................ 174/262
See application file for complete search history.

(56) References Cited

U.S. PATENT DOCUMENTS

| | | | | |
|---|---|---|---|---|
| 6,037,547 | A * | 3/2000 | Blish, II ................. | H05K 1/113 174/264 |
| 6,542,377 | B1 * | 4/2003 | Fisher .................... | H05K 1/114 174/259 |

(Continued)

*Primary Examiner* — Sherman Ng
(74) *Attorney, Agent, or Firm* — Sheppard Mullin Richter & Hampton LLP

(57) ABSTRACT

Systems and methods are provided for reducing crosstalk between differential signals in a printed circuit board (PCB) using fine pitch vias. A pair of contact pads are on the top surface of the PCB and configured to couple a PCB component to the PCB, the contacts a first distance from each other. A first via of a plurality of vias is electrically coupled to a first contact of the pair of contacts and a second via is electrically coupled to a second contact, the first via and second via a second distance from each other, the second distance being less than current standards for minimum via pitch. Each via comprises a via pad on the top surface and a plated through-hole extending from the top surface to a termination point. A separator gap is between the first via and the second via.

20 Claims, 12 Drawing Sheets

(56) References Cited

U.S. PATENT DOCUMENTS

| | | | | |
|---|---|---|---|---|
| 2004/0251047 | A1* | 12/2004 | Bartley | H05K 3/429 |
| | | | | 174/262 |
| 2006/0232301 | A1* | 10/2006 | Morlion | H05K 1/114 |
| | | | | 326/126 |
| 2007/0089292 | A1* | 4/2007 | Tourne | H05K 1/115 |
| | | | | 29/852 |
| 2008/0205011 | A1* | 8/2008 | Chan | H05K 1/0231 |
| | | | | 361/767 |
| 2015/0092373 | A1* | 4/2015 | Chan | H05K 1/111 |
| | | | | 361/767 |

* cited by examiner

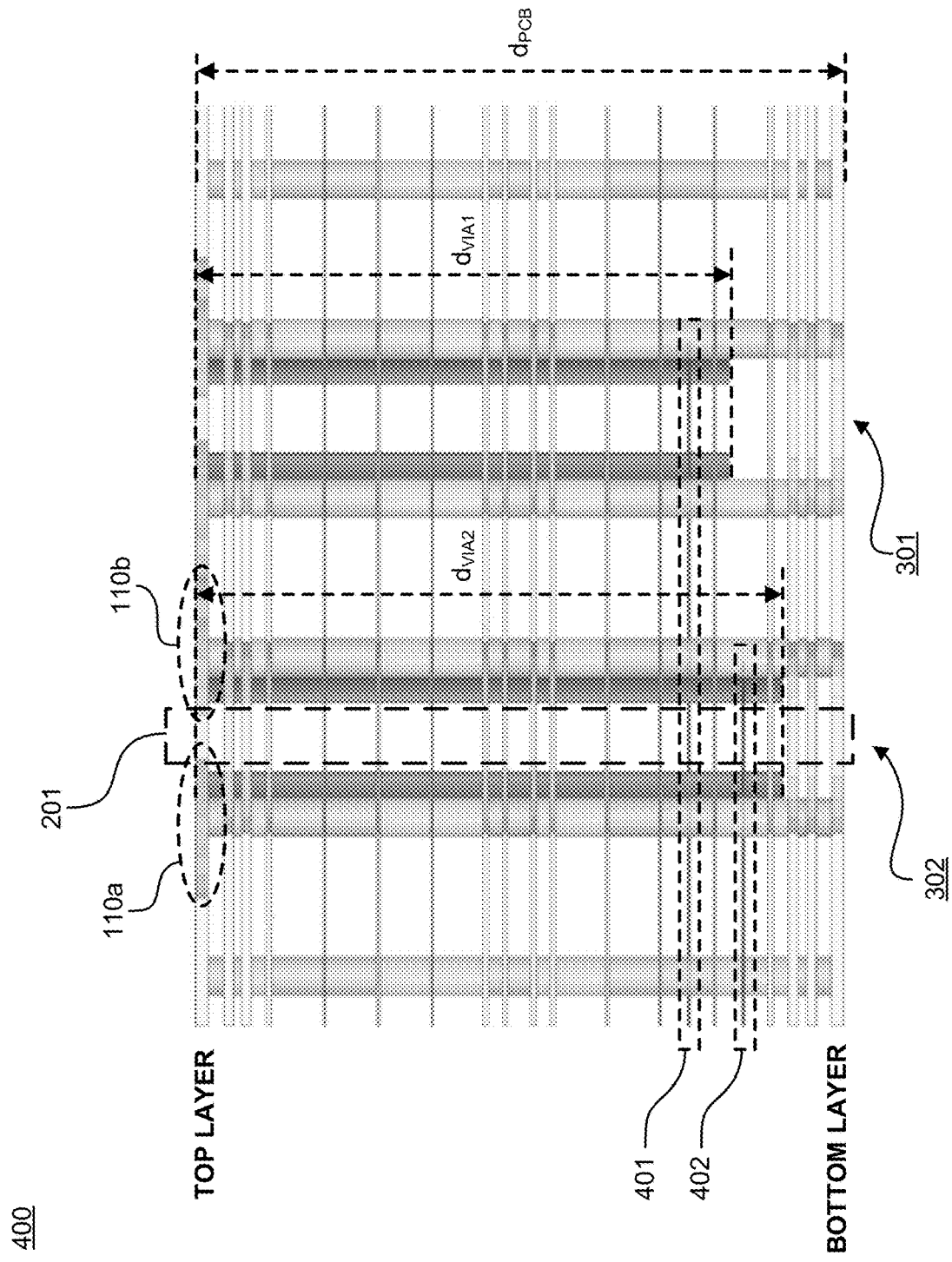

METHOD FOR CROSS-TALK REDUCTION TECHNIQUE WITH FINE PITCH VIAS

CROSS-REFERENCE TO RELATED APPLICATIONS

The present application claims priority to U.S. Provisional Application No. 62/852,285, filed May 23, 2019, the disclosure of which is herein incorporated by reference in its entirety.

DESCRIPTION OF RELATED ART

Designing a high-speed communication channel with minimized crosstalk is a key technology goal, essential to the successful product development and implementation of modern high-speed multi-level signaling systems.

In the design of high-speed interconnects, unwanted electrical crosstalk between adjacent signals is an important metric used when characterizing communication channels, and as such is treated as a noise to be suppressed. When not properly controlled, crosstalk normally results in increased bounded uncorrelated jitter (BUJ). This is a form of noise which can inhibit the proper functioning of high-speed communication channels.

In recently adopted PAM4 multi-level signaling applications, communication channels (e.g., SerDes) operating at very high-speed (e.g., 56+ Gbps) data rates, crosstalk plays a more critical role in the signal integrity of the channel, and industry experts agree that these high-speed channels become more sensitive to crosstalk and other impairments, as compared to more conventional NRZ data communication signaling, especially at higher data rates.

Crosstalk between neighboring signals can degrade these high-speed data channels by a factor of 6 to 9 according to industry experts, a direct result of employing the very sensitive multi-level PAM4 signaling. This is partly because of a greatly reduced eye height (to ⅓), but is also a result of the large variation in rise and fall times of these multi-level signals, both inherent to the nature of PAM4 technology.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 4 shows a side view of an example printed circuit board in accordance with embodiments of the technology disclosed herein.

Figure 1:
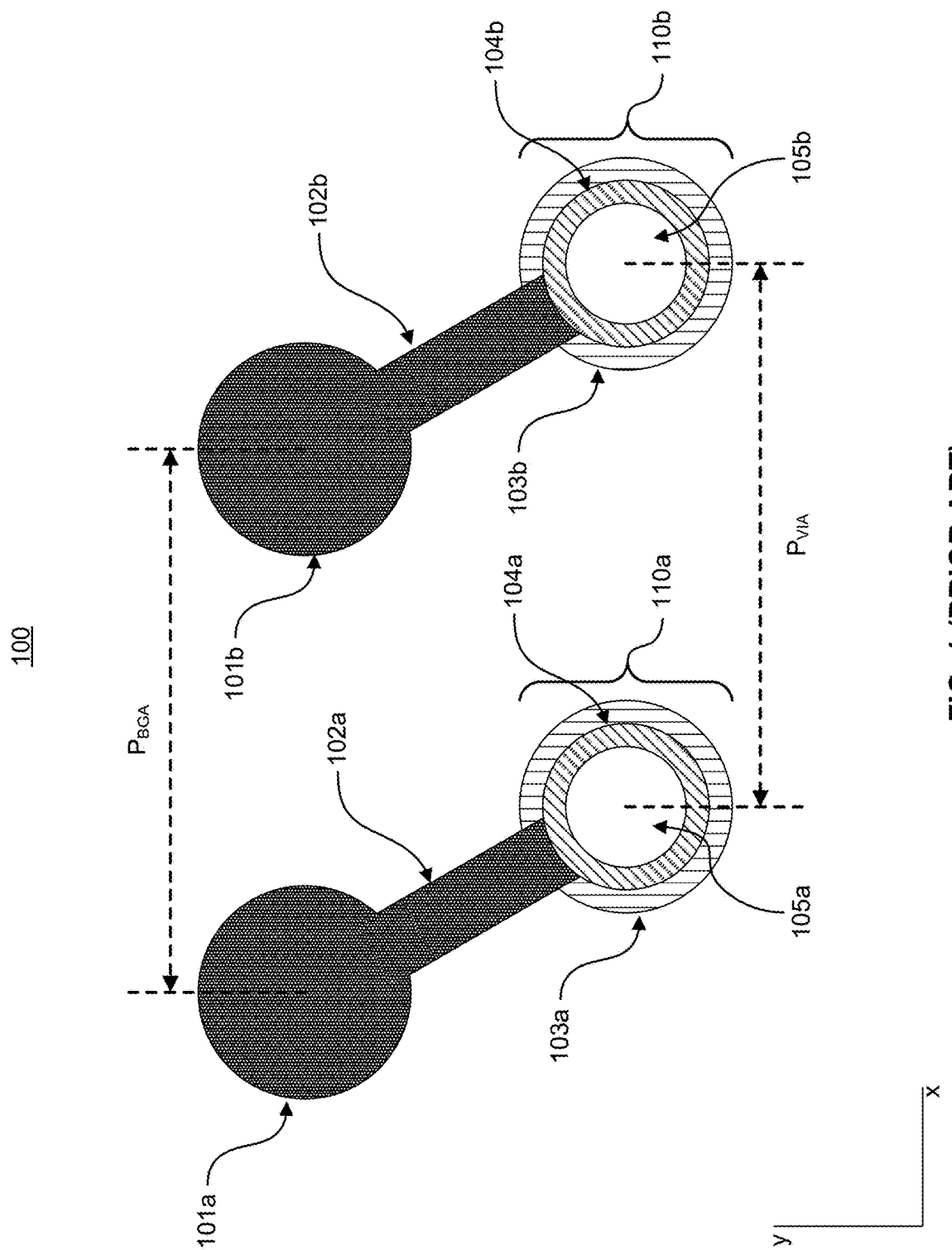
FIG. 1 shows a prior art footprint showing the pitch between coupled vias.

The figures are not exhaustive and do not limit the present disclosure to the precise form disclosed.

DETAILED DESCRIPTION

Embodiments of the present disclosure provides a method and apparatus with minimized crosstalk between adjacent signals. As described in greater detail below, embodiments of the technology disclosed herein provide a printed circuit board (PCB) configuration having a fine pitch between electrical vias, along with uniquely configured separation, therefore allowing for efficient support of high-speed communications. In various embodiments, a separator gap comprising one or more drilled through-holes at the center of the fine pitch intra-pair (i.e., within pair) electrical vias prevent contact between true and complementary signal vias of a differential pair when these are located in close proximity. These drilled through-holes allow significant reduction in crosstalk between the signals, as verified through simulation. The use of fine pitch vias provides several advantages in PCB high-speed routing, such as: 1) improving pair-to-pair crosstalk (which is very sensitive in PAM4 and other high-speed signaling); 2) more flexibility in PCB pad stack design, improving impedance discontinuities from the central processing unit (CPU) and/or application specific integrated circuit (ASIC) footprint region; and 3) allowing more space for traces escaping out of the via or pin field.

One circumstance where crosstalk can be particularly problematic is in the interface between integrated circuit chips and a PCB. Some of this is also due to design features of the PCB itself, such as board thickness and layer count. Crosstalk generated between the CPU and/or ASIC footprint vias in PCBs is generally proportional to the distance between each differential pair, and the lengths of the via barrels. In the worst-case, the vias could extend from top of the PCB, down to the bottom. A thicker PCB is expected to thus create a higher lateral near-end crosstalk (NEXT) from longer vias, which are located nearby to the left and right, and also above and below (i.e., east/west, north/south).

Current solutions to minimize crosstalk include increasing the separation between pairs of differential signals (i.e., inter-pair spacing). Ground stitching vias can be added between via pairs and/or guard traces can be added between horizontal trace routing pairs. Moreover, reducing the distance between true and complementary signal vias within a pair (i.e., intra-pair spacing, the distance between the vias) can also help to reduce crosstalk. Reducing the intra-pair via spacing is limited, however, by the fabrication process of PCBs due to the inability to obtain a via pitch below (roughly) 0.8 mm, and a ball grid array (BGA) pitch of roughly 1 mm. This limitation is due to vertical through-hole via registration tolerance in the PCB fabrication process. The technology disclosed herein provides a new design and manufacturing process for PCBs to enable smaller via pitches, further reducing the intra- and inter-pair crosstalk on the PCB.

FIG. 1 shows the standard CPU and/or ASIC package BGA footprint 100 for a prior art PCB design. The illustrated footprint 100 shows a dog-bone transition design, but the pitch characteristics are similar between dog-bone transition designs and via-in-pad designs, and the discussion is equally applicable to current pad-in-via designs. As shown in FIG. 1, the footprint 100 can comprise a plurality of BGA pads 101a, 101b (generally, "the BGA pad 101," collectively, "the BGA pads 101"). A BGA pad is a contact pad configured to couple to a corresponding connection element on a PCB component (e.g., an integrated chip). For ease of reference, only two BGA pads 101 are depicted in FIG. 1, but in implementation each BGA grid will comprise two or more BGA pads 101. Each of the BGA pads 101 are configured to electrically couple to a corresponding solder ball or other connection point on a circuit component, such as one or more types of integrated chips, including but not limited to CPUs, ASICs, graphics processing units (GPUs), field programmable gate arrays (FPGAs), processor chips, among others. The BGA pads 101 comprise a conductive material capable of enabling electrical signals to and from the integrated chip to one or more electrical traces of the PCB.

Electrical signals are routed through layers of the PCB through the use of vias. A via is an opening in an oxide layer of the PCB that allows a conductive connection between different layers of the PCB. As shown in FIG. 1, each BGA pad 101a, 101b can be connected to a via 110a, 110b, respectively (generally, "the via 110," collectively, "the vias 110"). The footprint 100 depicted in FIG. 1 includes a dog-bone transition 102a, 102b (generally, "the dog-bone transition 102," collectively, "the dog-bone transitions 102") that electrically connects the each BGA pad 101 with a respective via 110. Another type of design in the prior art includes a via-in-pad design, wherein each via 110 is positioned such that a portion of the via 110 is underneath the associated BGA pad 101. In some embodiments, one or more BGA pads 101 may not have an associated via 110.

In the depicted embodiment of FIG. 1, each via 110 comprises a via pad 103a, 103b (generally, "the via pad 103," collectively, "the via pads 103") and a plated through-hole 104a, 104b (generally, "the plated through-hole 104," collectively, "the plated through-holes 104"), respectively. The plated through-holes 104 are plated with a conductive material, including but not limited to copper, gold, or other metal, to enable the electrical signals to be conducted through the center hole 105a, 105b of the vias 110a, 110b, respectively. Generally, the via pitch $P_{VIA}$ for a differential pair of signals follows the BGA pad pitch $P_{BGA}$. As discussed above, the prior art is limited in the size of the BGA pad pitch PA and the via pitch $P_{VIA}$ possible. Traditionally, the BGA pad pitch $P_{BGA}$ can be as small as 1 mm, while the via pitch $P_{VIA}$ can be the as small as 0.8 mm. A reason behind this limitation in the possible via pitch $P_{VIA}$ is the current vertical through-hole via registration tolerance of PCB manufacturing practices. Mis-registration can cause shorts and impedance discontinuity, which can render the entire assembly unsuitable for its intended purpose. The current tolerance in manufacturing practices requires that the vias be spaced no less than 0.8 mm. In addition, the drilling tolerances also limit the lower limit for via pitch to ensure that such shorts do not develop, whether between the two vias and/or the electrical traces. As the via pitch $P_{VIA}$ moves closer to 0.8 mm under current conditions, there is a higher probability of cross-contact between the via pads 103 and/or the plated through-holes 104. Such cross-contact would result in a short circuit of the electrical signals. Current tolerances in the fabrication process of PCBs do not allow for via pitch $P_{VIA}$ to be smaller than 0.8 mm to avoid such issues.

Figure 2A:
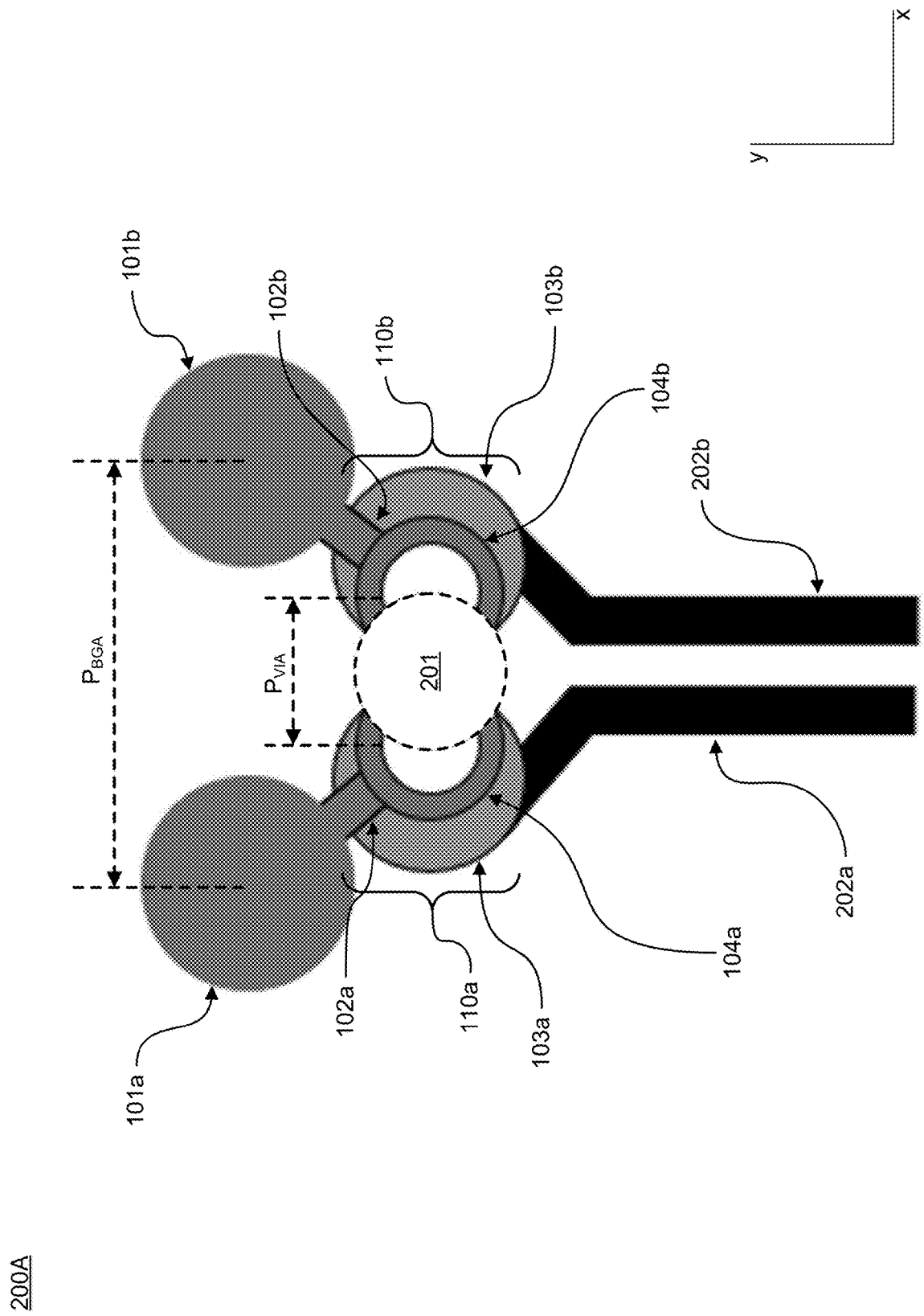
FIG. 2A illustrates an example footprint having a dog-bone transition in accordance with embodiments of the technology disclosed herein.
Figure 2B:
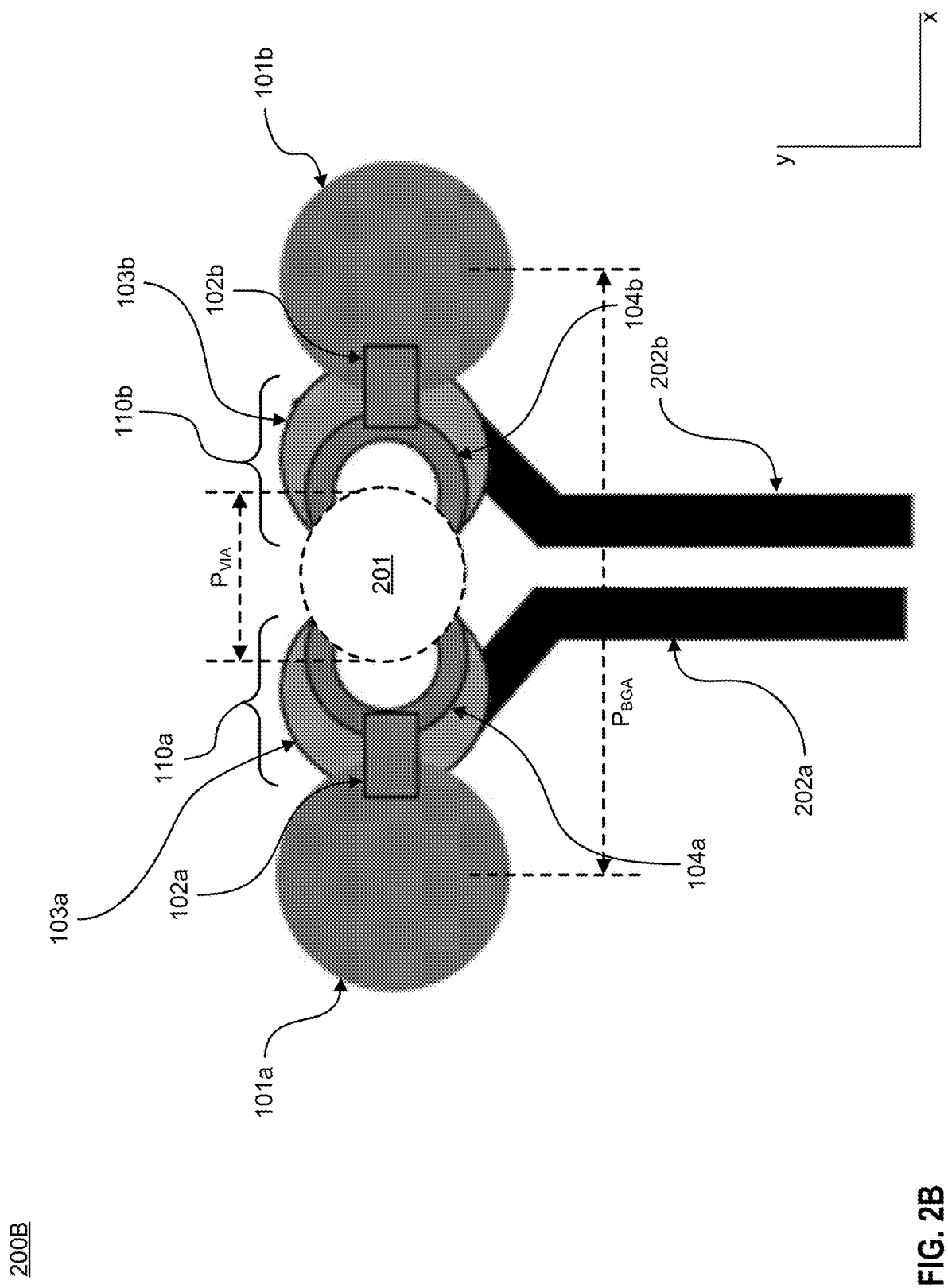
FIG. 2B illustrates another example footprint having a dog-bone transition in accordance with embodiments of the technology disclosed herein.
Figure 2C:
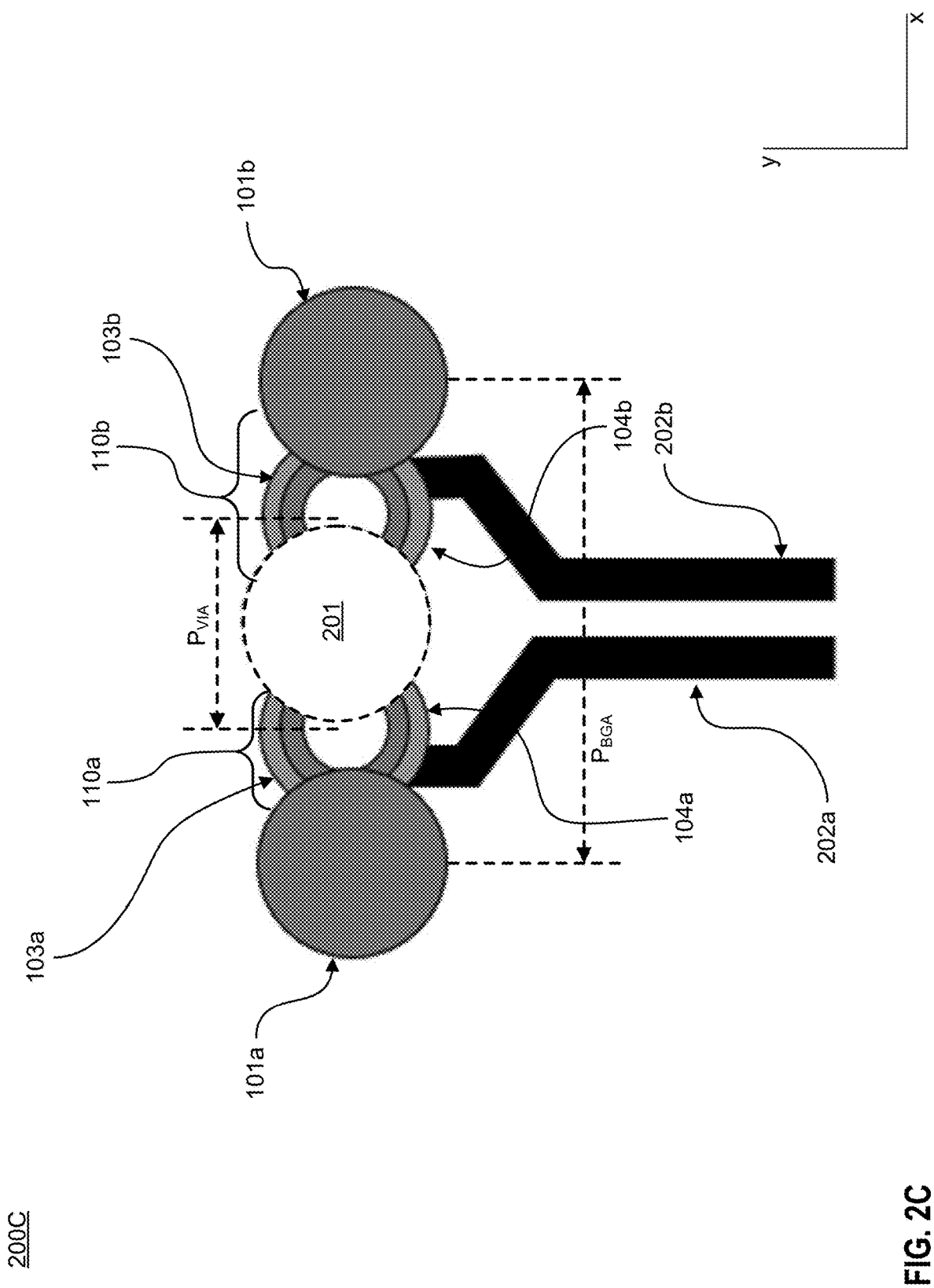
FIG. 2C illustrates an example footprint having a via-in-pad configuration in accordance with embodiments of the technology disclosed herein.

FIGS. 2A-2C illustrates example fine pitch via footprints 200A, 200I, 200C in accordance with embodiments of the technology disclosed herein. The example fine pitch via footprints of FIGS. 2A-2C are provided for illustrative purposes only and should not be interpreted as limiting the scope of the technology disclosed herein to the depicted examples 200A, 200I, 200C. Each of the example footprints 200A, 200B, 200C enable via pitch $P_{VIA}$ as fine as 0.5 mm. In some embodiments, the via pitch $P_{VIA}$ can be smaller than 0.5 mm. Where common references are used in different figures it should be interpreted that any discussion of such references within the present disclosure applies to each instance of the reference unless expressly stated otherwise. In various embodiments, a plurality of fine pitch via footprints 200A, 200B, 200C can be disposed on a PCB. In some embodiments, one or more of the example footprints 200A, 2006, 200C can be disposed on the PCB. In some embodiments, one component interface grid of a PCB can comprise one of the example footprints 200A, 200B, 200C, and at least one other component interface grid can comprise a different one of the example footprints 200A, 2006, 200C.

In FIG. 2A, the example footprint 200A includes a dog-bone transition type of connection in accordance with embodiments of the technology disclosed herein. The footprint 200A includes a plurality of BGA pads 101. In various embodiments, the BGA pad pitch $V_{BGA}$ may be a standard distance corresponding to the footprint of integrated chips known in the art, including but not limited to the range of distances from 0.8 mm to 1 mm. In some embodiments, the BGA pad pitch $P_{BGA}$ may be longer than 1 mm. Each BGA pad 101 is connected to the vias 110 using a dog-bone transition 102. Unlike in the prior art, the dog-bone transitions 102 do not each have the same orientation. Rather, as shown in FIG. 2A, one dog-bone transition 102a is oriented towards the lower right corner (i.e., downward in the positive X direction along the x-axis), while the other dog-bone transition 102b is oriented towards the lower left corner (i.e., downward in the negative X direction along the x-axis). In this manner, the dog-bone transitions 102 are capable of electrically connecting the BGA pads 101 to the plated through-holes 104 of the respective vias 110. The vias 110 in footprint 200A are positioned differently than compared to the current orientation in FIG. 1. In various embodiments, the vias 110 are positioned such that the via pitch $P_{VIA}$ is 0.5 mm. The vias 110 may be oriented such that via pitch $P_{VIA}$ falls within the BGA pad pitch $P_{BGA}$, as shown in FIG. 2A.

With a via pitch $P_{VIA}$ less than 0.8 mm there is a likelihood of the conductive materials of the different vias 110 would come in contact due to fabrication tolerances of the PCB. Designs in accordance with the present disclosure overcome this issue by drilling a separator gap 201 between the two vias 110. The separator gap 201 removes the portions of the vias 110 such that the two vias 110 will not contact each other. The size of the separator gap 201 can be chosen to secure a sufficient opening between the two vias 110. In various embodiments, the separator gap 201 may have a diameter equivalent to the via pitch $P_{VIA}$, while in other embodiments the separator gap 201 may have a diameter that is larger than the via pitch $P_{VIA}$. In some embodiments, the diameter of the separator gap 201 may be determined based on the fabricated size of the vias 110. The separator gap 201 can be an air separator gap, separating the plated through-hole and via pad of each via 110 from contacting each other. The separator gap 201 makes each via 110 an incomplete circle. The separator gap 201 defines a perimeter of the first via and the second via such that the first via 110a is defined as a first arc and the second via 110b is defined as a second arc. The separator gap 201 avoids contact between the fine pitch true and complementary vias (i.e., the vias 110 for a differential signal). In various embodiments, the separator gap 201 may comprise an air gap, wherein the air serves to separate the conductive elements of each plated through-hole 104. In other embodiments, the separator gap 201 may be filled with a non-conductive material.

In some embodiments, the vias 110 may be configured in a similar manner as traditional vias 110. That is, the via pad 103 is a circular shape with a shared center as the plated through-hole 104. In some embodiments, a better escape scheme is possible by designing the vias 110 such that the via pads 103 are not circular in shape (e.g., elliptical). In this way, the exposed remaining via metal can be tailored to allow even closer spacing than a circular via hole can permit. In other embodiments, the vias 110 can be designed such that the via pads 103 do not share a center with the plated through-hole 104, as illustrated in FIG. 2A. In such embodiments, the via pitch $P_{VIA}$ may not correspond to the center point of the via pad 103. The plated through-hole 104 of each via 110 may be electrically connected to an inner via pad (not shown in FIG. 2A). In various embodiments, the inner via pad can be disposed on an inner layer of the PCB below the via 110 and one or more electrical traces 202a, 202b may be electrically connected to the inner via pad to route the electrical signal within the respective layer of the PCB. In some embodiments, one or more electrical traces 202a, 202b may be disposed on a top layer of the PCB and electrically connected to the vias 110 disposed on the top layer. The inner via pad can be disposed on any electrical layer of the PCB, and in some embodiments a plurality of inner via pads may be electrically connected to the plated through-hole 104 of the via 110.

FIG. 2B illustrates another example footprint 200B using a dog-bone transition 102 to connect the BGA pad 101 to the via 110. In example footprint 200B, each of the vias 110 are disposed between each BGA pad 101 within the same plane. In the example footprint 200A, the dog-bone transitions 102 were used to route the electrical signal from the BGA pads 101 to the vias 110 disposed in a separate plane, in some embodiments a plane below the BGA pads 101 (i.e., a position along the Y-axis lower than the BGA pads 101), while in other embodiments the vias 110 may be disposed in a plane above the BGA pads 101 (i.e., a position along the Y-axis higher than the BGA pads 101). In various embodiments, a portion of the BGA pads 101 may rest above a portion of the via pad 103, but not over the plated through-hole 104. As discussed above, the plated through-hole 104 comprises the conductive portion of the via 110. Because the BGA pads 101 in footprint 200B are not disposed over the plated through-holes 104, the dog-bone transitions 102 are still required to electrically couple the BGA pads 101 to each of the respective plated through-holes 104.

As stated above, instead of using the dog-bone transition 102 discussed with respect to FIGS. 1-28, the integrated chip footprint on the PCB can have the BGA pad 101 electrically coupled to the plated through-hole 104 without the need for a transition trace. This type of design is referred to as a via-in-pad design because BGA pad 101 is disposed on top of both the via pad 103 and the plated through-hole 104, thereby enabling the electrical signal to and from an integrated chip connected to the BGA pad, and is directly routed along the plated through-hole 104 to one or more inner via pads, to route the electrical signal within different electrical layers of the PCB. FIG. 2C illustrates another example footprint 200C in accordance with the technology disclosed herein. In the footprint 200C, a via-in-pad design is used. As shown in FIG. 2C, the vias 110 may be disposed between and in the same plane as the BGA pads 101, similar to the placement of the vias 110 discussed with respect to FIG. 2B. As depicted in FIG. 2C, a portion of the BGA pad 101 is disposed on top of a portion of the via pad 103 and the plated through-hole 104. In this design, the BGA pad 101 is directly electrically connected to the via 110.

In various embodiments, each of the example footprints 200A, 2008, 200C can be configured to conduct a differential signal from a connected PCB component. A first BGA pad 101a can be configured to conduct a true signal to and from the connected PCB component and the first via 110a, and a second BGA pad 101b can be configured to conduct a complementary signal to and from the connected PCB component and the second via 110b.

Figure 2F:
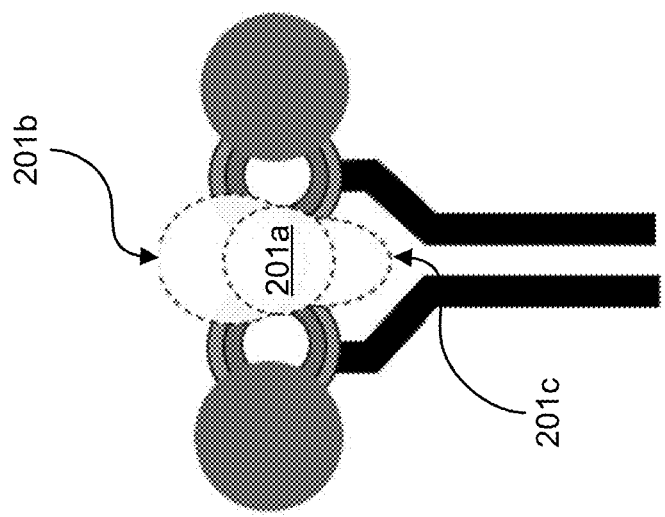
FIG. 2F illustrates another example footprint having a via-in-pad configuration in accordance with embodiments of the technology disclosed herein.
Figure 2E:
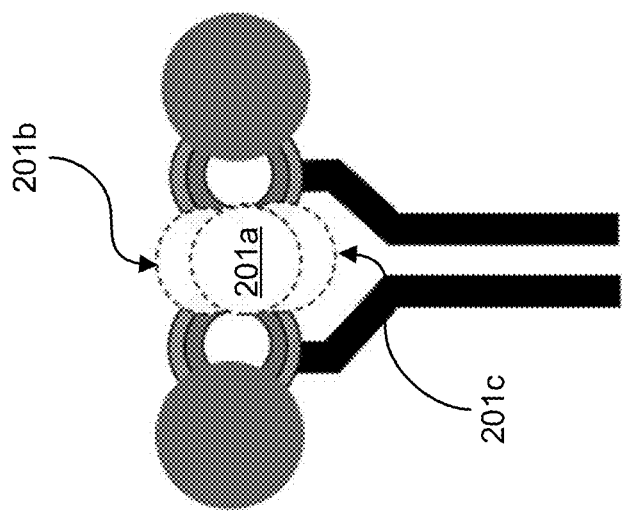
FIG. 2E illustrates another example footprint having a via-in-pad configuration in accordance with embodiments of the technology disclosed herein.
Figure 2D:
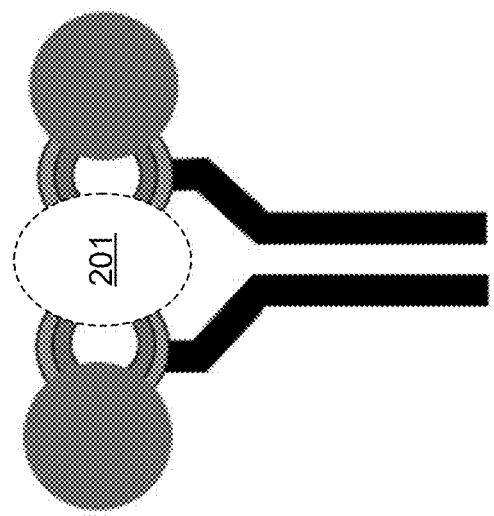
FIG. 2D illustrates another example footprint having a via-in-pad configuration in accordance with embodiments of the technology disclosed herein.

In various embodiments, the separator gap 201 may comprise one or more shapes. As illustrated in FIGS. 2A-2C, the separator gap 201 can comprise a circular shape. In other embodiments, the separator gap 201 can be elliptical as illustrated in FIG. 2D. In other embodiments, the shape of the separator gap 201 can comprise a non-uniform shape as shown in FIGS. 2E and 2F. A non-uniform shape can be achieved by using one or more drill through-holes. In FIG. 2E, the non-uniform can comprise a first drill hole 201a, second drill hole 201b, and a third drill hole 201c, wherein each drill hole comprising the separator gap 201 comprises a circular shape. In some embodiments, the size of each of the first drill hole 201a, second drill hole 201b, and third drill hole 201c may be the same, while in other embodiments one or more of the drill holes 201a-201c may comprise a different size relative to another one of the drill holes 201a-201c. As shown in FIG. 2F, the non-uniform shape can combine a combination of different shaped drill holes 201a-201c. As illustrated, the second and third drill holes 201b, 201c can comprise an elliptical shape, and the first drill hole 201a can comprise a circular shape. In various embodiments, the non-uniform shape of the separator gap 201 can be symmetrical (as shown in FIG. 2E), or asymmetrical (as shown in FIG. 2F).

Figure 3:
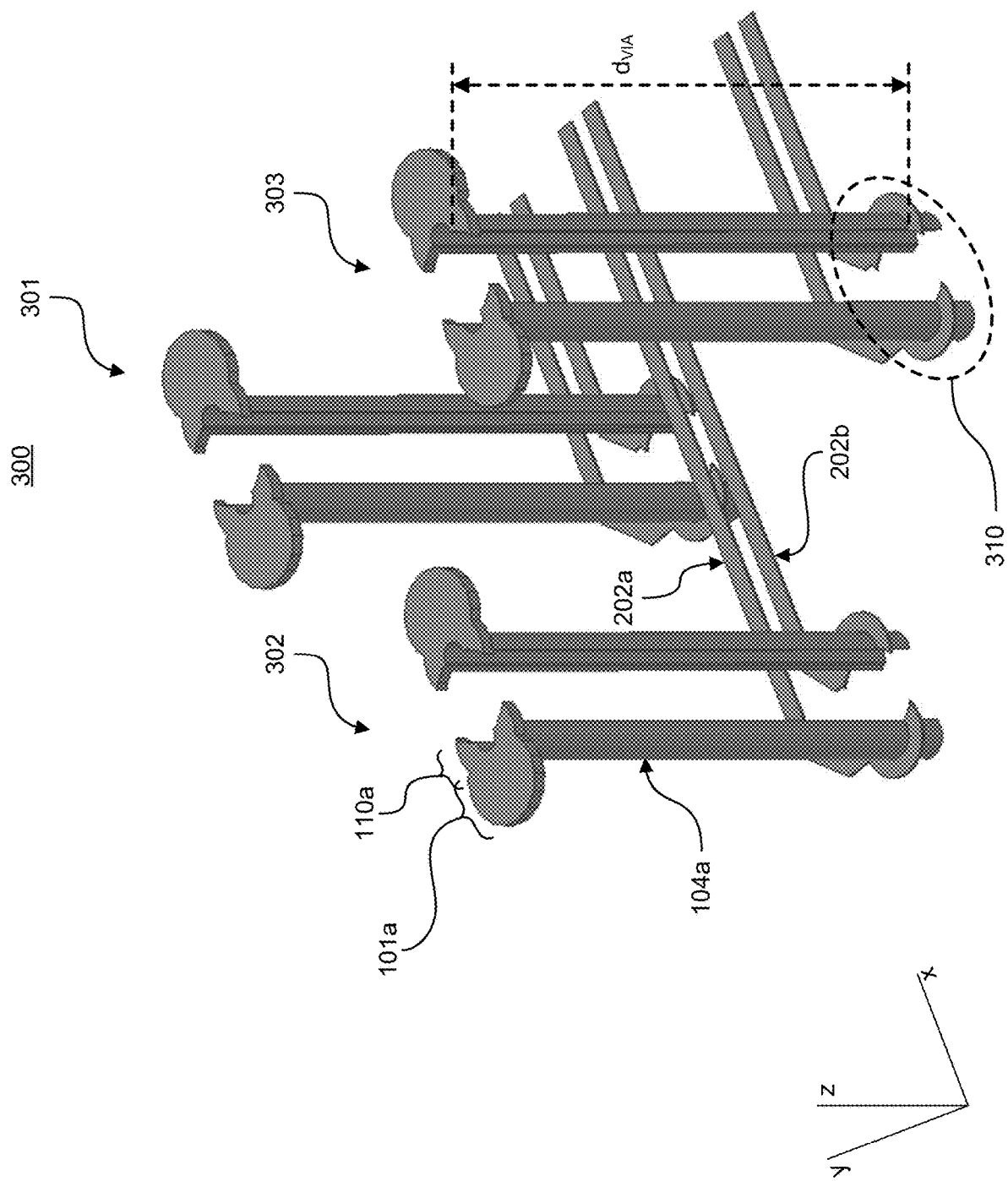
FIG. 3 shows a perspective view of example sets of differential pair vias in accordance with embodiments of the technology disclosed herein.

In all of the example footprints 200A, 200B, 200C, the separator gap 201 is drilled in the middle of the two vias 110. In various embodiments, this separator gap 201 can extend the entire depth of the PCB in which the vias 110 are built. FIG. 3 illustrates a perspective view 300 of example set of differential pair vias in accordance with embodiments of the technology of the present disclosure. The example perspective view 300 is provided for illustrative purposes and should not be interpreted as limiting the scope of the technology to the depicted embodiment. The example perspective view 300 shows three sets of differential pair vias 301, 302, 303. The layers of the PCB and other elements of the PCB that may be associated with the sets of differential pair vias 301, 302, 303 have been removed for ease of viewing. The crosstalk effect within the PCB can vary based on the position of the sets of differential pair vias to each other. For example, the crosstalk between the first set of differential pair vias 301 and the second set of differential pair vias 302 may be stronger in some embodiments than the crosstalk generated between the first set of differential pair vias 301 and the third set of differential pair vias 303 because the second set of differential pair vias 302 may be closer on the PCB to the first set 301 than the third set 303 is to the first set 301. In some embodiments, one or more ground pins (not shown in FIG. 3) may be disposed between the lateral pair (i.e., the first set 301 and the third set 303).

As shown in FIG. 3, each set of differential pair vias 301, 302, 303 can have a via depth $d_{VIA}$ extending from the top layer of the PCB to an inner via pad 310 at an inner layer (not shown in FIG. 3). In other embodiments, the via depth $d_{VIA}$ can extend from the top layer of the PCB to a termination point below the inner via pad 310 (as shown in FIG. 4). In various embodiments, the depth $d_{VIA}$ of each set of differential pair vias 301, 302, 303 may be longer or shorter than at least one other set of differential pair vias 301, 302, 303. One or more sets of differential pair vias 301, 302, 303 may connect to one or more intermediate inner via pads (not shown in FIG. 3) at a layer of the PCB within the via depth $d_{VIA}$. In such embodiments, the via depth $d_{VIA}$ indicates the length of the via (i.e., the plated through-hole 104) to the deepest inner via pad 310. In various embodiments, one or more intermediate inner via pads may be non-functional pads having no electrical traces 202 connected thereto. One or more non-functional pads can be included for one or more performance characteristics, including but not limited to controlling the impedance of the associated via 110. In various embodiments, the electrical traces 202a, 202b are electrically connected to the inner via pad 310, serving as the trace escape for the differential signal pair communicated over the set of differential pair vias 301, 302, 303. In various embodiments, one or more electrical traces 202a, 202b may be electrically connected to the plated through-hole, such as plated through-hole 104a.

FIG. 4 illustrates aside view 400 of a PCB in accordance with embodiments of the technology disclosed herein. The side view 400 is provided for illustrative purposes only and should not be interpreted as limiting the scope of the technology to the depicted embodiment. As shown in FIG. 4, two sets of differential pair vias 301, 302 are illustrated. The first set of differential pair vias 301 can have a first via depth $d_{VIA1}$, and the second set of differential pair vias 302 can have a second via depth $d_{VIA2}$. Having different via depths $d_{VIA}$ enables differential signals to be routed on different layers of the PCB. In the illustrated embodiment, the first set of differential pair vias 301 can route the electrical signals received from a connected integrated chip over a first signal trace 401. The first signal trace 401 comprises the electrical traces and the inner via pad discussed above with respect to FIGS. 2A-3. The second set of differential pair vias 302 in various embodiments can route the electrical signal received from an integrated chip on a second signal trace 402. In various embodiments, the separator gap 201 can extend through the entire depth $d_{PCB}$ of the PCB whereas each set of differential pair vias 301, 302 can terminate at a lowest connected layer of the PCB for the respective set of differential pair vias 301, 302. In this manner, the first and second plated through-holes 104 of each set of differential pair vias 301, 302, 303 forms a first and second arc, respectively, like the first arc and second arc discussed above with respect to the first and second vias 110 of FIG. 2A.

The fine pitch between the vias possible with the technology of the present disclosure allows for reduction of both near-end crosstalk (NEXT) and far-end crosstalk (FEXT). NEXT is a measurement of the interference between two signals in the same plane of the PCB. As a non-limiting example, the NEXT measurement can refer to the interference between the vias disposed on the top layer of the PCB of two sets of differential pair vias, like those discussed with respect to FIG. 3. FEXT measures the interference between the sets of differential pair vias at a far end of the conductive path, such as the inner via pads 310 discussed with respect to FIG. 3.

Figure 5A:
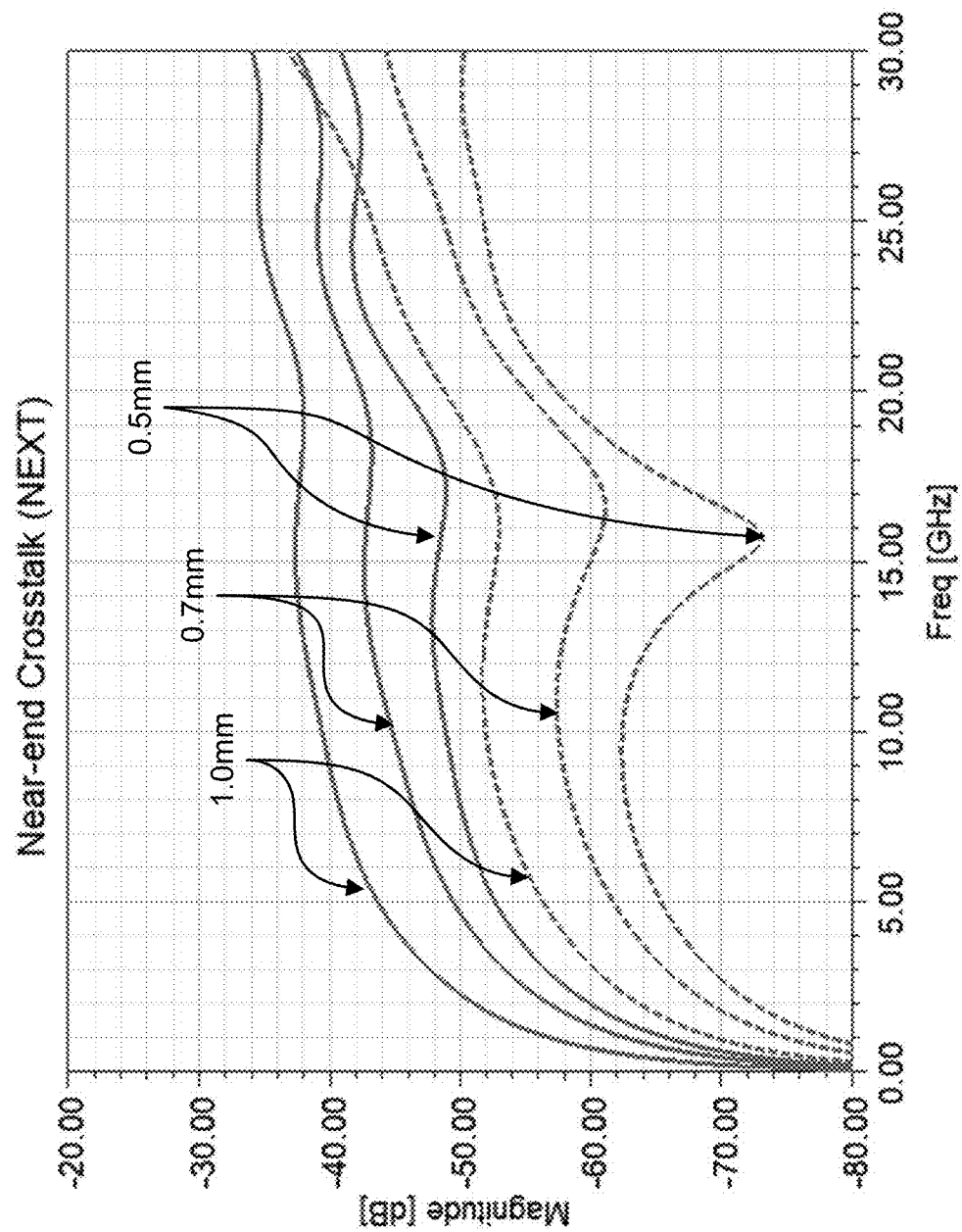
FIG. 5A is a plot showing the magnitude of near end cross talk (NEXT) at different via pitches in accordance with embodiments of the technology disclosed herein.
Figure 5B:
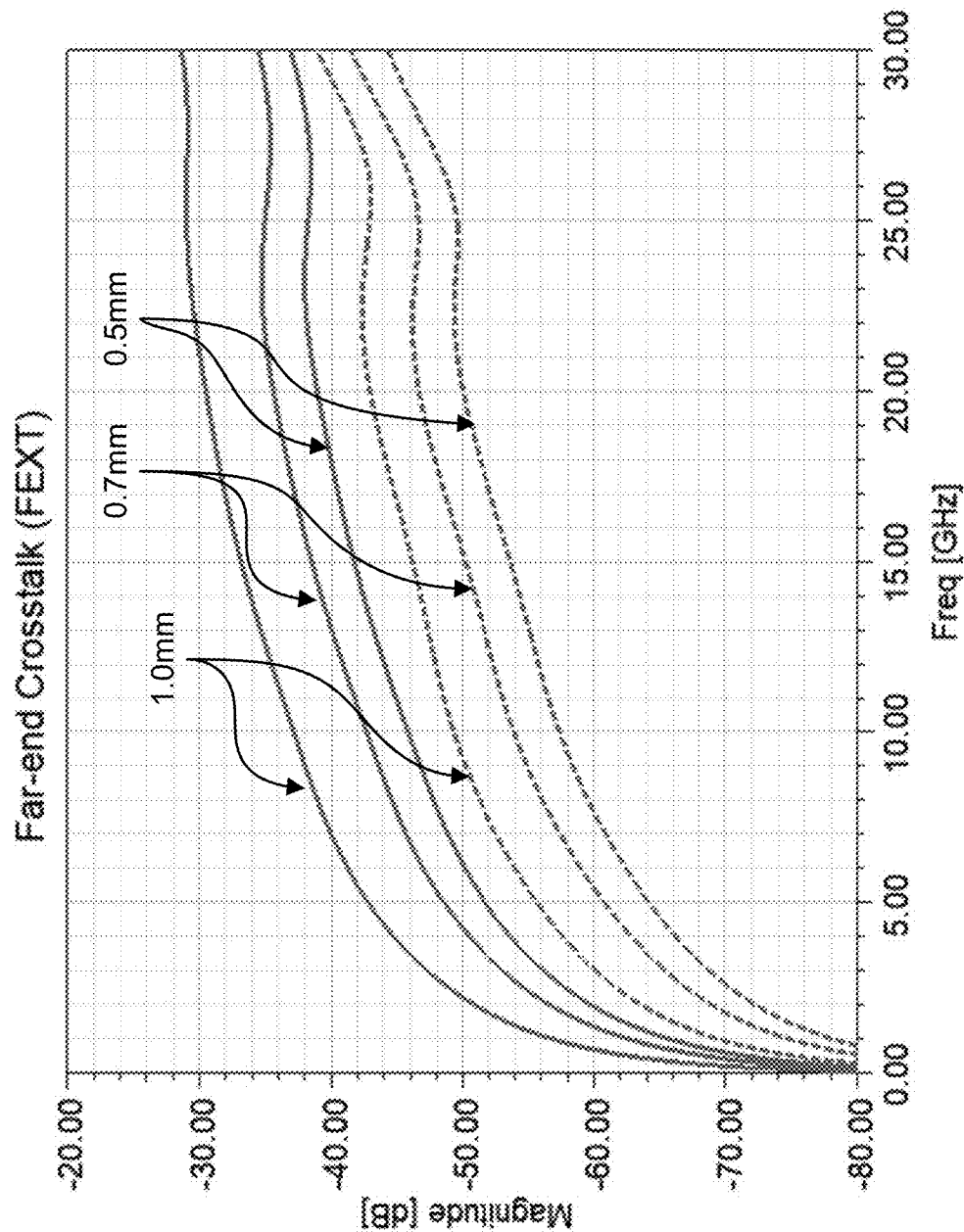
FIG. 5B is a plot showing the magnitude of far end cross talk (FEXT) at different via pitches in accordance with embodiments of the technology disclosed herein.

FIGS. 5A and 5B are plots showing the magnitude of the NEXT (FIG. 5A) and the FEXT (FIG. 5B) interference at different via pitch distances in accordance with embodiments of the technology disclosed herein. The plots of FIGS. 5A and 5B are based on a simulated model PCB design, using the worst-case example where the PCB design includes bottom layer routing, providing the longest possible via length. The modeled PCB design included a similar configuration of sets of differential pair vias 301, 302, 303 discussed with respect to FIG. 3, where the second set of differential pair vias 302 comprised the offset via pad embodiment (where the via pad and the plated through-hole do not share a center point) while the first and third set of differential pair vias 301, 303 comprise a via with the via pad and plated through-hole having the same center point. For purposes of the simulation, the separator gap 201 between the vias of each set of differential pair vias is chosen to have the same diameter as the via pad of the vias. As stated above, the diameter of the separator gap 201 can be larger or smaller than the diameter of the via pad.

Referring to FIG. 5A, the plot shows the magnitude of the NEXT between the first set of differential pair vias 301 and the second set of differential pair vias 302 (the solid lines in the plot of FIG. 5A) and between the first set of differential pair vias 301 and the third set of differential pair vias 303 (the broken lines in the plot of FIG. 5A). The magnitude is shown at three different via pitch distances: 1.0 mm; 0.7 mm; 0.5 mm. As shown, the magnitude of NEXT at 0.5 mm via pitch results in a lower NEXT magnitude between the first set 301 and the second set 302, providing a reduction of roughly 11 dB in the simulation. In various embodiments, the amount of reduction may vary depending on the actual fabrication of the PCB, such as the type of via design used. An even greater reduction in NEXT between the first set 301 and the third set 303 can be seen in the plot of FIG. 5A. This is expected between the diagonal pair (first set 301 and second set 302) and the lateral pair (first set 301 and third set 303) because the signal traces connected to the second set 302 are closer to the first set 301 than the third set 303. Moreover, one or more ground pins (not shown in FIG. 3) are generally disposed between the first set 301 and the third set 303 but are not disposed between the first set 301 and the second set 302. The ground pins lower the crosstalk between the first set 301 and the third set 303, but no such reduction occurs between the first set 301 and the second set 302 since there is no ground pin disposed between them.

The plot of FIG. 5B illustrates the magnitude of FEXT interference at the three via pitch distances discussed with respect to FIG. 5A. As seen, a similar reduction in magnitude is achieved by using the fine via pitch compared to the standard 1.0 mm that is the common limit of PCB fabrication processes. At all frequencies tested, the design having the 0.5 mm via pitch reduced the magnitude of the FEXT compared to other via pitch distances.

Figure 6:
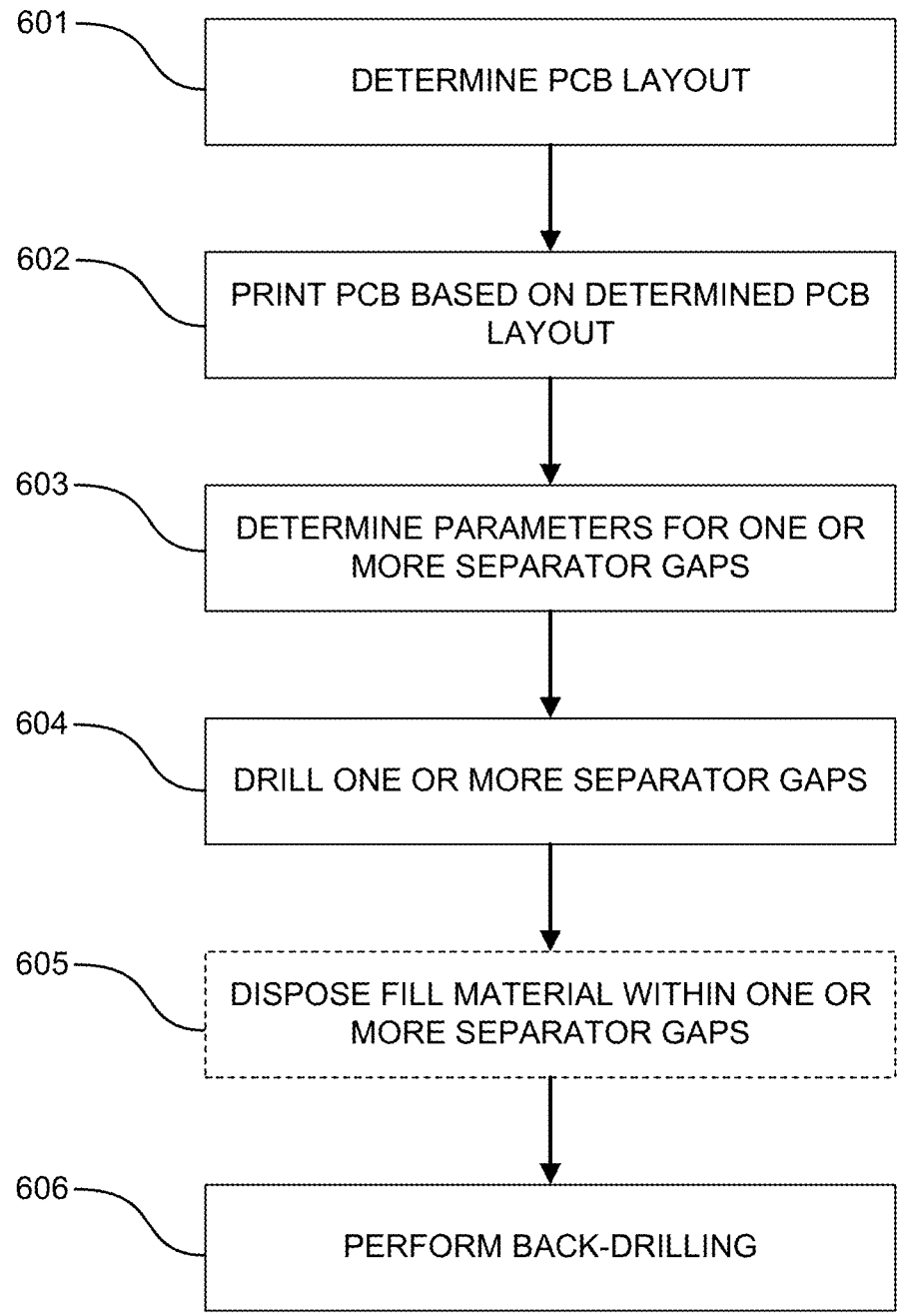
FIG. 6 is an example method in accordance with embodiments of the technology disclosed herein.

FIG. 6 is an example method 600 in accordance with embodiments of the technology of the present disclosure. The method 600 is provided for illustrative purposes only and should not be interpreted as limiting the scope of the technology to only the depicted embodiment. The example method 600 provides a method of designing a PCB having fine-pitched vias in accordance with the technology disclosed herein. At operation 601, the PCB layout is determined. In various embodiments, determining the PCB layout can comprise determining the location of electrical traces, vias, BGA interfaces, grounds, and other components to be disposed on the PCB. Designing the PCB layout may further comprise determining the layers where inner via pads and electrical traces, similar to those discussed above, are to be disposed.

In various embodiments, determining the PCB layout can further comprise associating a set of contact pads (and a set of coupled vias to the set of contact pads) to function as a cooperating pair for differential signaling, like the differential signaling discussed above. Each coupled via can be electrically coupled to a corresponding contact pad with a dog-bone transition in some embodiments, while in other embodiments the coupled via can be implemented in a via-in-pad design wherein the contact pad would be directly electrically coupled to the coupled via. In various embodiments, the coupled vias can be designed to have a predetermined distance between each other, wherein the predetermined distance between the coupled vias is less than a predetermined distance between the associated set of contact pads. As a non-limiting example, two contact pads (e.g., BGA pads) can be designed such that there is 1 mm between each other, whereas the distance between the vias coupled to each of those two contact pads can be 0.5 mm.

At operation 602, the PCB is printed based on the PCB layout. One or more known methods of printing or laminating PCBs can be used to generate a PCB having the layout determined at operation 601. Printing of the PCB layout results in a PCB comprising the plurality of contact pads and coupled vias disposed in a component interface region, configured to couple to an integrated chip. In various embodiments, the integrated chip can be one of the integrated chips discussed above with respect to FIGS. 2A-5B. A plurality of component interface regions can be disposed in the PCB in various embodiments, allowing a plurality of integrated chips to be coupled to the PCB. At operation 603, the parameters of one or more separator gaps between the coupled vias is determined. The separator gaps can be similar to the separator gap discussed above with respect to FIGS. 2A-5B. Each pair of coupled vias having the predetermined distance less than the predetermined distance of the contact pads can have a separator gap disposed between them. In various embodiments, the parameters may comprise one or more of the locations of the separator gap, the dimensions of the separator gap, the shape of the separator gap, among others.

The one or more separator gaps can be drilled at operation 604. In various embodiments, the separator gaps can each comprise a drill hole extending the entire depth of the PCB. In various embodiments, the separator gap may be drilled from the top of the PCB to the bottom of the PCB in some embodiments, while in some embodiments the separator gap can be drilled from the bottom of the PCB to the top. In various embodiments, the separator gap may be drilled from the top of the PCB to a first depth and drilled up from the bottom of the PCB to a second depth. The first depth and the second depth may be equal in some embodiments (i.e., the first and second depths are 50% of the total depth of the PCB), while in other embodiments the first depth and the second depth can be different. The first and second depths combine to equal the total depth of the PCB.

At operation 605, an optional fill material may be disposed within one or more of the separator gaps. As discussed above, in some embodiments a non-conductive material may be disposed within the separator gap, while in other embodiments the separator gap can comprise an air gap (i.e., no filler material is used). In some embodiments, the filler material may be disposed less than the full length of the separator gap (i.e., extend from the top surface to a depth less than the total depth of the PCB). Back-drilling can be performed on the vias at operation 606. As discussed with respect to FIG. 4, the furthest inner via pad for a given via may be on a layer above the bottom layer of the PCB. However, the plated through-hole of the via may extend beyond the final inner via pad for that particular via in some embodiments. Back-drilling can be used to remove the excess plated through-hole portion to avoid any electrical issues (e.g., unwanted resonances and excess capacitance). In various embodiments, a drill larger than the diameter of the plated through-hole is used, and a back-drill hole is drilled from the bottom of the PCB to a plated through-hole termination point within the PCB. In some embodiments, the termination point may be at the layer of the PCB directly underneath the layer having the last inner via pad for that via disposed, while in other embodiments the termination point can be a point between the bottom of the PCB to the last inner via pad configured to enable the electrical signal conducting through the plated through-hole to escape to at least one electrical trace within the PCB. In various embodiments, one or more operations of the method 600 can be performed earlier or later in the process. As a non-limiting example, the operation 606 can be performed before operation 604.

Figure 7:
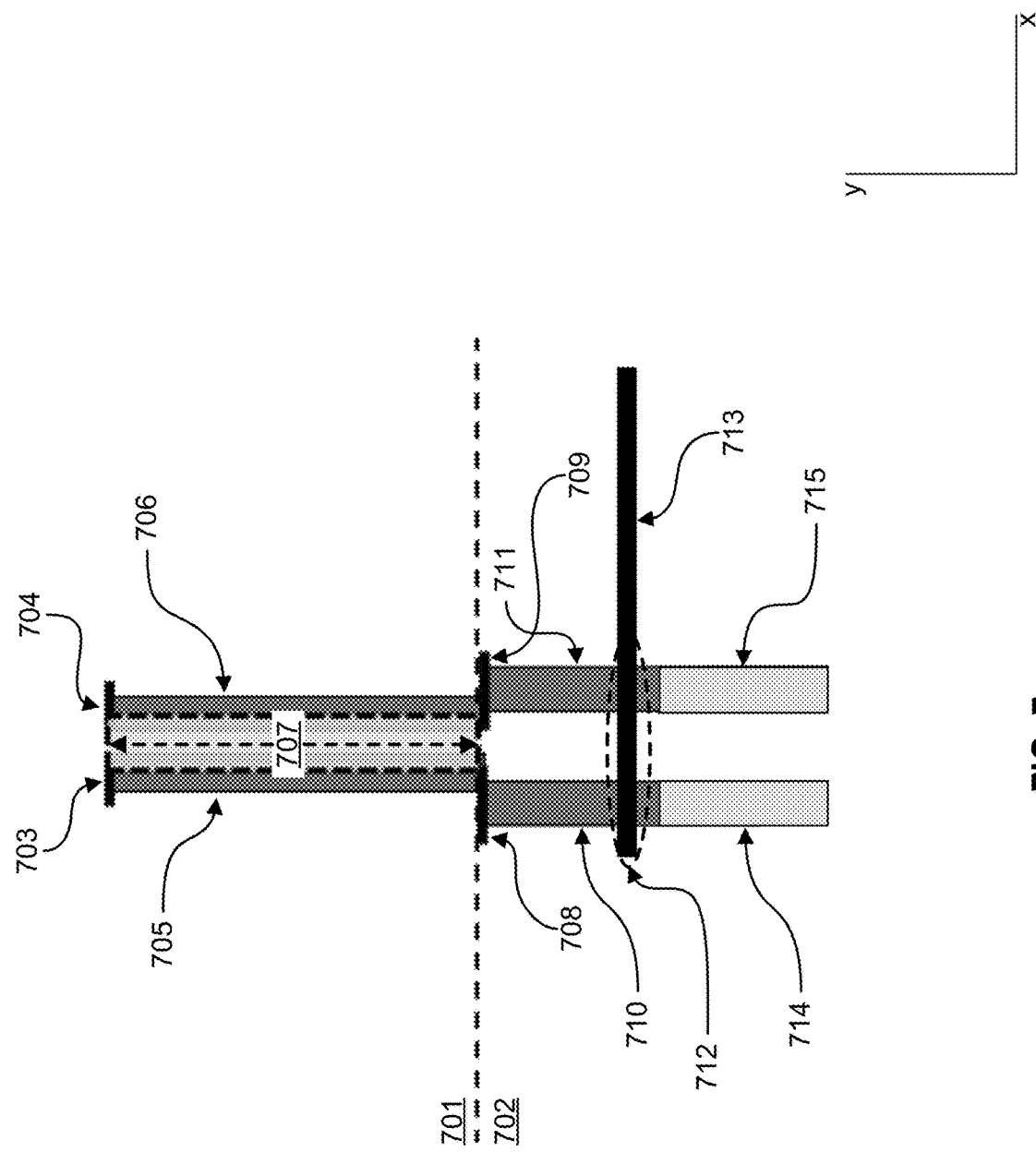
FIG. 7 shows an example sequentially laminated fine-pitched via in accordance with embodiments of the technology disclosed herein.

In some embodiments, the PCB may be fabricated using sequential lamination. Sequential lamination is a process wherein a laminated PCB (i.e., the printed PCB) is laminated to another laminated PCB or copper layer. FIG. 7 illustrates an example fine-pitched via 700 constructed using sequential lamination in accordance with embodiments of the technology disclosed herein. The example fine-pitched via 700 is provided for illustrative purposes and should not be interpreted as limiting the scope of the technology to only the depicted embodiment. As shown in FIG. 7, the fine-pitched via 700 includes a first PCB 701 and a second PCB 702, as demarcated by the broken line. The broken line represents the connection point P of the first PCB 701 and the second PCB 702 through sequential lamination. In various embodiments, one or more methods of sequential lamination may be used to connect the first PCB 701 and the second PCB 702.

The first PCB 701 comprises a first coupled via pair, having a first via pad 703 and a second via pad 704 disposed on a top surface of the first PCB 701. As discussed above with respect to FIGS. 2A-5B, on the top surface of the PCB is disposed the BGA (or contact) pad configured to connect the integrated chip and a via pad. In various embodiments, the first via pad 703 and the second via pad 704 can be electrically coupled to a BGA pad (not shown in FIG. 7) by a dog-bone transition, while in other embodiments the electrical connection can be direct where the first and second via pads 703, 704 are configured as a via-in-pad design, having the BGA pad disposed directly above the conductive portion of the via pad (i.e., the portion of the plated through-hole encompassed by the via pad). The first and second via pads 703, 704 can be spaced such that the pitch between the first and second via pads 703, 704 is less than a pitch between the BGA pads to which the first and second via pads 703, 704 are coupled. This via pitch (or distance between the vias) may be less than 0.8 mm in some embodiments. In various embodiments, the distance/via pitch may be within the range from 0.25 mm to 0.8 mm.

The first plated through-hole 705 and the second plated through-hole 706 can disposed within the first via pad 703 and second via pad 704, respectively. The first and second plated through-holes 705, 706 may be similar to the plated through-holes discussed above with respect to FIGS. 2A-5B. The separator gap 707 is disposed/drilled between the first plated through-hole 705 and the second plated through-hole 706. The first PCB 701 can be fabricated in a similar manner as that discussed with respect to the method 600 of FIG. 6.

As shown in FIG. 7, the second PCB 702 can be configured with vias consistent with current PCB fabrication processes. That is, the vias in the second PCB 702 are not as finely pitched as the vias 703, 704 in the first PCB 701. The second PCB 702 can include a first board interface via pad 708 and a second board interface via pad 709. In various embodiments, the first board interface via pad 708 and the second board interface via pad 709 can be disposed a predetermined distance such that the conductive portion of the first board interface via pad 708 is electrically coupled to the first plated through-hole 705 and the conductive portion of the second board interface via pad 709 is electrically coupled to the second plated through-hole 706 when the first PCB 701 and the second PCB 702 are sequentially laminated. In this manner, the electrical signal conducted by the first and second through-holes 705, 706 can be transferred to the first and second board interface via pads 708, 709, respectively. The conductive portion of the first and second board interface via pads 708, 709 can comprise a secondary plated through-hole 710, 711, respectively. The secondary plated through-holes 710, 711 can carry the electrical signals to an inner via pad 712 disposed within the second PCB 702, which can enable the electrical signals to escape over one or more electrical traces 713. In various embodiments, the inner via pad 712 can comprise pads, one connected to each of the secondary plated through-holes 710, 711. Two back-drills 714, 715 may be drilled from the bottom of the second PCB 702 to remove the excess material of the secondary plated through-holes 710, 711, similar to the back-drilling discussed with respect to FIG. 6. In FIG. 7, the back-drills 714, 715 represent a portion of the secondary plated through-holes 710, 711 where the conductive material has been removed. In some embodiments, the back-drills 714, 715 may have a larger diameter than the secondary plated through-hole 710, 711, respectively.

Figure 8:
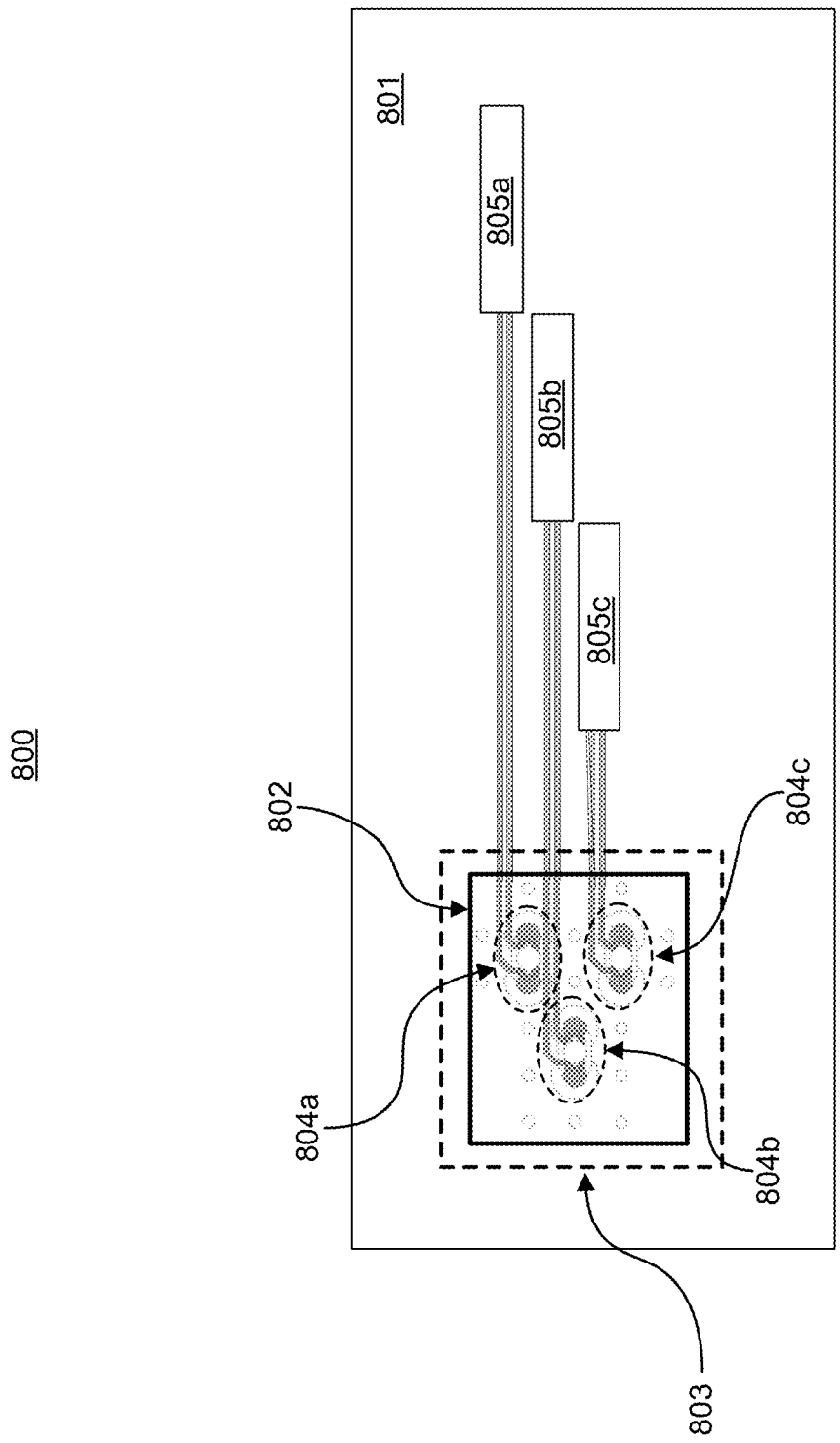
FIG. 8 is an example printed circuit board assembly in accordance with embodiments of the technology disclosed herein.

FIG. 8 illustrates an example PCB assembly 800 in accordance with embodiments of the technology disclosed herein. The example PCB assembly 800 is provided for illustrative purposes only and should not be interpreted as limiting the scope of the technology to only the depicted embodiment. For ease of reference, the example PCB assembly 800 of FIG. 8 omits other components that are commonly disposed on PCBs, but a person of ordinary skill in the art would appreciate that such omitted components would be included for the basic functioning of the PCB. As a non-limiting example, a plurality of signal contacts disposed on the surface of the PCB 801 have been omitted but a person of ordinary skill in the art would know that the top surface of the PCB 801 would include a plurality of signal contacts (e.g., a plurality of contact pads similar to the BGA pads discussed above with respect to FIG. 1). As shown in FIG. 8, the PCB 801 can have a component interface grid 802 disposed on the top surface of the PCB 801. In various embodiments the PCB 801 may be fabricated in accordance with the operations discussed above with respect to FIG. 6. In various embodiments, this circuit interface grid 802 can comprise a grid of one or more types of fine pitch vias, such as one or more of the fine pitch vias discussed with respect to FIGS. 2A-5B. In various embodiments, one or more component interface grids 802 may be disposed on the PCB 801.

An integrated chip 803 can be connected to the component interface grid 802. In various embodiments, the integrated chip 803 can have a grid of solder balls or other connection elements disposed on a bottom side of the integrated chip, the grid of solder balls configured to mate to the grid of contact/BGA pads within the component interface grid 802. The integrated chip 803 may be connected to the component interface grid 802 through one or more connection processes known in the art, including but not limited to solder reflow. As discussed above, a set of contact pads can be configured to cooperate and transfer a differential signal (e.g., a positive terminal for the true signal and a negative terminal for the complementary signal). For ease of reference, three differential pair contacts 804a-c are shown in FIG. 8, but a plurality of differential pair contacts 804 can be disposed within the component interface grid 802 in various embodiments. In various embodiments, a plurality of PCB components 805a-c may be disposed on the PCB 801. The plurality of PCB components 805a-c can include but are not limited to analog-to-digital converters (ADCs), digital-to-analog converters (DACs), sensors, light sources, transmitters, receivers, transceivers, electrical and/or optical connectors, CPUs, GPUs, ASICs, FPGAs, resistors, inductors, capacitors, switches, among others. Although the illustrated embodiment 800 shows each of the signals of the differential pair contacts 804a-c being routed over electrical traces to different PCB components 805a-c, respectively, this is only an example. In other embodiments, one or more differential pair contacts can be electrically connected over one or more electrical traces to the same PCB component 805a-c.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A printed circuit board (PCB) comprising:
   a depth defined by a top surface and a bottom surface;
   a pair of contact pads on the top surface and configured to couple a PCB component to the top surface, the pair of contact pads being a first distance from each other;
   a pair of vias on the top surface, a first via electrically coupled to a first contact pad of the pair of contact pads and a second via electrically coupled to a second contact pad of the pair of contact pads, the first via and the second via being a second distance from each other, each via comprising:
      a plated through-hole extending from the top surface to a termination point along the depth defined by the top surface and the bottom surface; and
      a via pad on the top surface and connected to the plated through-hole; and
   a separator gap between the first via and the second via, the separator gap defining a perimeter of the first via as a first arc and defining a perimeter of the second via as a second arc,
   wherein the second distance is less than the first distance, the second distance being less than 0.8 mm.

2. The PCB of claim 1, wherein the pair of contact pads is configured to conduct a differential signal from the PCB component, the first contact pad configured to conduct a true signal and the second contact pad configured to conduct a complementary signal.

3. The PCB of claim 1, wherein the separator gap comprises an air gap between an outer portion of the first via and an outer portion of the second via such that the outer portion of the first via and the outer portion of the second via do not contact each other.

4. The PCB of claim 3, wherein a non-conductive filler material is disposed within the separator gap.

5. The PCB of claim 1, wherein the second distance is within a range from 0.25 mm and 0.8 mm.

6. The PCB of claim 1, further comprising:
   the first contact pad and the first via electrically connected using a dog-bone transition; and
   the second contact pad and the second via electrically connected using a dog-bone transition.

7. The PCB of claim 1, further comprising:
   the first contact pad and the first via comprising a first via-in-pad, at least a portion of the first contact pad is above and electrically connected to the first via; and
   the second contact pad and the second via comprising a first via-in-pad, at least a portion of the second contact pad is above and electrically connected to the second via.

8. The PCB of claim 1, further comprising at least one inner via pad electrically coupled to the plated through-hole of the first via and the plated through-hole of the second via, wherein the at least one inner via pad is on an inner layer between the top surface and the bottom surface.

9. The PCB of claim 8, further comprising one or more electrical traces electrically coupled to the at least one inner via pad.

10. The PCB of claim 1, further comprising a plurality of pairs of contact pads and a plurality of pairs of vias, each pair of vias electrically coupled to a respective pair of contact pads of the plurality of contact pads.

11. The PCB of claim 1, wherein the pair of contact pads and the pair of vias are configured to route a differential signal from the PCB component.

12. The PCB of claim 1, wherein the separator gap extends from the top surface to the bottom surface regardless of the termination point of the first via and the termination point of the second via.

13. A method comprising:
   determining a printed circuit board (PCB) layout, including identifying locations of one or more pairs of contacts pads and one or more pairs of vias;
   printing a PCB based on the determined PCB layout;
   determining parameters for one or more separator gaps configured to keep each via of the one or more pairs of vias from contacting each other;
   drilling the one or more separator gaps; and
   performing back-drilling each via of the one or more pairs of vias,
   wherein each contact pad of the one or more pairs of contact pads are a first distance from each other, each via of the one or more pairs of vias are a second distance from each other, and the second distance is less than the first distance.

14. The method of claim 13, wherein the parameters for each of the one or more separator gaps includes one or more of a location of the separator gap between a first via and a second via of a respective one of the one or more pairs of vias and a diameter of the separator gap between the first via and the second via of a respective one of the one or more pairs of vias.

15. The method of claim 13, wherein determining the PCB layout further comprises:
   associating at least one pair of vias with a respective pair of contact pads;
   determining a configuration for coupling each via of the at least one pair of vias to a respective contact pad of the respective pair of contact pads; and
   determining the first distance and the second distance.

16. The method of claim 13, further comprising disposing a non-conductive filler material within one or more of the one or more separator gaps.

17. A printed circuit board (PCB) assembly comprising:
   a first PCB comprising a top surface and a bottom surface, the top surface and the bottom surface defining a depth;
   a plurality of component interface grids on the top surface of the first PCB, each component interface grid comprising:

a plurality of pairs of contact pads, a first contact pad of each pair of contact pads a first distance from a second contact pad of the respective pair of conduct pads;

a plurality of pairs of vias, each pair of vias being associated with a respective pair of contact pads of the plurality of pairs of contact pads, a first via of each pair of vias a second distance from a second via of the respective pair of vias, each via comprising:
  a plated through-hole extending from the top surface to a termination point along the depth defined by the top surface and the bottom surface; and
  a via pad on the top surface and connected to the plated through-hole; and
a separator gap between the first via and the second via of each pair of vias configured such that the first via and second via are not in contact with each other, the separator gap defining a perimeter of the first via as a first arc and defining a perimeter of the second via as a second arc; and an integrated chip coupled to a first component interface grid, wherein the second distance is less than the first distance, the second distance being less than 0.8 mm.

18. The PCB assembly of claim 17, wherein each pair of contact pads of the first component interface grid is configured to conduct a differential signal from the integrated chip, a first contact pad of a respective pair of contact pads configured to conduct a true signal and a second contact pad of the respective pair of contact pads configured to conduct a complementary signal.

19. The PCB assembly of claim 17, wherein the second distance is within a range from 0.25 mm and 0.8 mm.

20. The PCB assembly of claim 17, wherein the termination point of the plated through-hole of each via of at least one pair of vias is on the bottom surface of the first PCB, the PCB assembly further comprising:
  a second PCB comprising a second top surface and a second bottom surface, the second top surface and the second bottom surface defining a second PCB depth;
  a pair of board interface vias on the second top surface, each board interface via configured to electrically couple to a respective termination point of the plated through-hole of a via of the at least one pair of vias, a first board interface via a third distance from a second board interface via; and
  the first PCB being above the second PCB,
  wherein the third distance is larger than the second distance.

* * * * *